(12) United States Patent  
Kurosawa

(10) Patent No.: US 10,461,013 B2  
(45) Date of Patent: Oct. 29, 2019

(54) HEAT SINK AND ELECTRONIC COMPONENT DEVICE

(71) Applicant: SHINKO ELECTRIC INDUSTRIES CO., LTD., Nagano-shi, Nagano (JP)

(72) Inventor: Takuya Kurosawa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/987,390

(22) Filed: May 23, 2018

(65) Prior Publication Data

US 2018/0374773 A1 Dec. 27, 2018

(30) Foreign Application Priority Data

Jun. 26, 2017 (JP) ................................. 2017-123920

(51) Int. Cl.
*H01L 23/367* (2006.01)
*H01L 21/48* (2006.01)

(52) U.S. Cl.
CPC ...... *H01L 23/3675* (2013.01); *H01L 21/4878* (2013.01); *H01L 23/367* (2013.01); *H01L 2224/16225* (2013.01); *H01L 2224/32225* (2013.01); *H01L 2224/73204* (2013.01); *H01L 2224/73253* (2013.01); *H01L 2924/16152* (2013.01)

(58) Field of Classification Search
CPC .. H01L 21/4871; H01L 23/3672; H01L 23/34
USPC ....... 257/276, 625, 675, 706, 707, 712–722, 257/796, E33.075, E31.131, E23.051, 257/E23.08–E23.113; 438/122
See application file for complete search history.

(56) References Cited

U.S. PATENT DOCUMENTS

| | | | |
|---|---|---|---|
| 5,151,777 A * | 9/1992 | Akin | H01L 23/3735 257/712 |
| 2003/0131476 A1* | 7/2003 | Ocher | B22F 3/26 29/890.03 |
| 2011/0149537 A1* | 6/2011 | Kurosawa | H01L 23/3675 361/760 |
| 2012/0113599 A1 | 5/2012 | Yonemochi | |
| 2013/0105964 A1* | 5/2013 | Seki | H01L 23/3675 257/712 |
| 2015/0311137 A1* | 10/2015 | Oganesian | H01L 23/3675 257/712 |

FOREIGN PATENT DOCUMENTS

| JP | 5-031248 | 4/1993 |
|---|---|---|
| JP | 8-316376 | 11/1996 |

(Continued)

*Primary Examiner* — Jonathan Han
(74) *Attorney, Agent, or Firm* — Rankin, Hill & Clark LLP

(57) ABSTRACT

A heat sink may include: a flat plate portion; a first protruding portion which is formed on an outer peripheral portion of the flat plate portion so as to surround a central portion of the flat plate portion and which protrudes in a thickness direction of the flat plate portion; an extending portion which extends outward from the flat plate portion; and a second protruding portion which is formed on the extending portion such that the first protruding portion is positioned between the second protruding portion and the central portion of the flat plate and which protrudes in the thickness direction of the flat plate portion.

8 Claims, 22 Drawing Sheets

(56) References Cited

FOREIGN PATENT DOCUMENTS

| JP | 11-112169 | 4/1999 |
|----|-----------|--------|
| JP | 2005-012127 | 1/2005 |
| JP | 2012-099727 | 5/2012 |

* cited by examiner

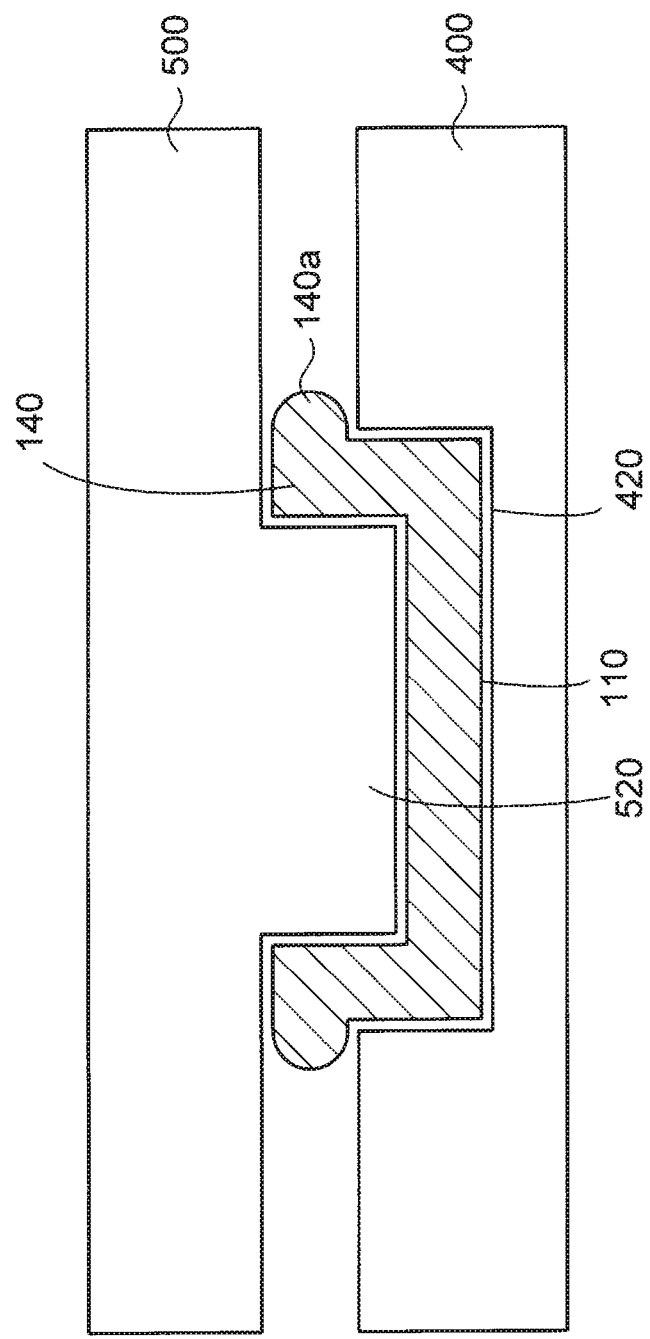
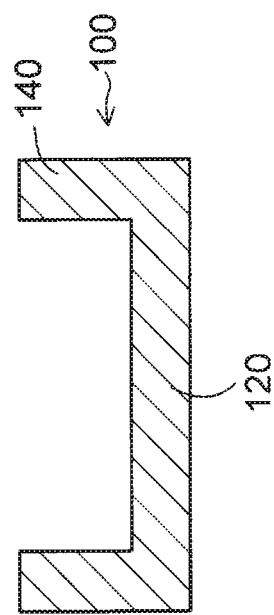
FIG. 4A
FIG. 4B

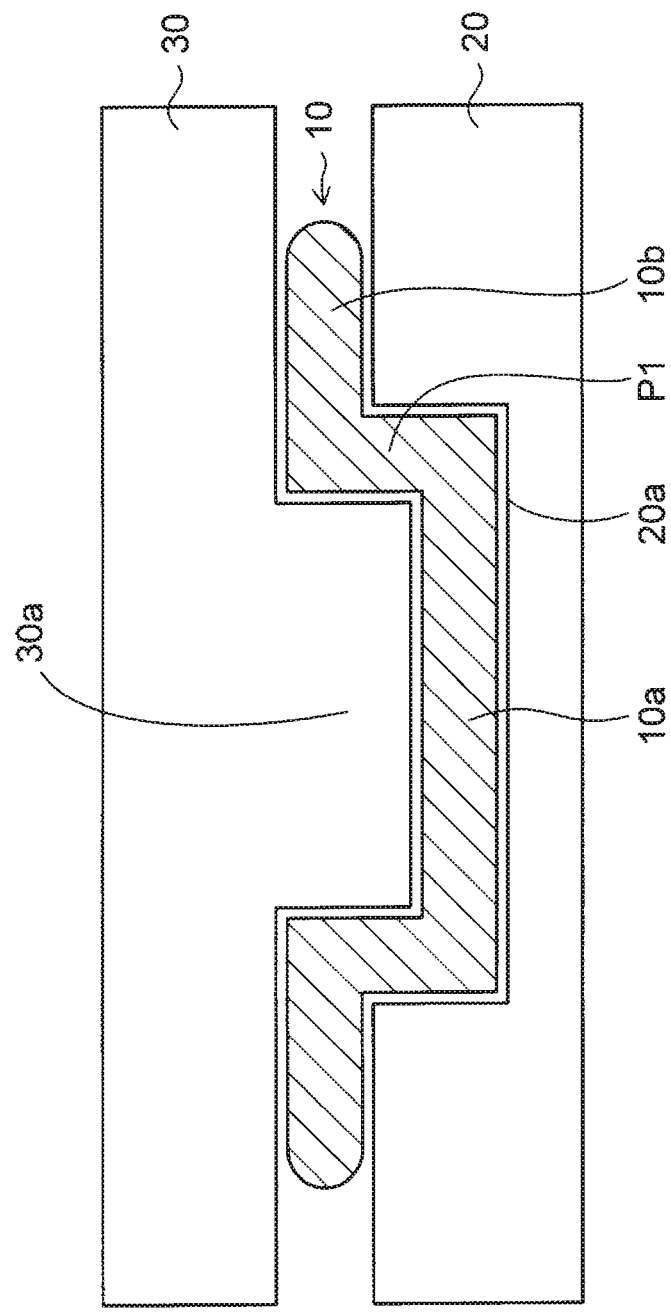

HEAT SINK AND ELECTRONIC COMPONENT DEVICE

This application claims priority from Japanese Patent Application No. 2017-123920 filed on Jun. 26, 2017, the entire contents of which are herein incorporated by reference.

BACKGROUND

1. Technical Field

Embodiments of the present disclosure generally relate to a heat sink and an electronic component device including the heat sink.

2. Background Art

In the background art, there are semiconductor devices in each of which a semiconductor chip is flip-chip connected on a wiring board. In such a semiconductor device, a heat sink is disposed on a back surface of a semiconductor chip in order to efficiently dissipate heat generated from the semiconductor chip (see e.g., JP-UM-A-5-31248, JP-A-8-316376, JP-A-11-112169, JP-A-2005-12127, and JP-A-2012-99727).

As will be described in an undermentioned preliminary matter, in a semiconductor device, a heat sink is disposed on a wiring board on which a semiconductor chip is mounted, and the semiconductor chip is thermally coupled to the heat sink.

When heat cycles are applied to the semiconductor device, bending stress is applied to the heat sink due to a change in a warping state of the wiring board. For this reason, tight contact between the semiconductor chip and the heat sink may deteriorate or the heat sink may come off the semiconductor chip. Consequently, excellent thermal coupling between the semiconductor chip and the heat sink may be spoiled.

SUMMARY

Certain embodiments provide a heat sink. The heat sink may comprise: a flat plate portion; a first protruding portion which is formed on an outer peripheral portion of the flat plate portion so as to surround a central portion of the flat plate portion and which protrudes in a thickness direction of the flat plate portion; an extending portion which extends outward from the flat plate portion; and a second protruding portion which is formed on the extending portion such that the first protruding portion is positioned between the second protruding portion and the central portion of the flat plate and which protrudes in the thickness direction of the flat plate portion.

Certain embodiments provide an electronic component device. The electronic component device may comprise: a wiring board; an electronic component which is mounted on the wiring board; and a heat sink which is mounted on the wiring board so as to be thermally connected to the electronic component. The heat sink may comprise: a flat plate portion; a first protruding portion which is formed on an outer peripheral portion of the flat plate portion so as to surround the electronic component and which protrudes in a thickness direction of the flat plate portion; an extending portion which extends outward from the flat plate portion; and a second protruding portion which is formed on the extending portion such that the first protruding portion is positioned between the second protruding portion and the electronic component and which protrudes in a thickness direction of the flat plate portion. The first protruding portion is mounted on the wiring board and the flat plate portion is connected to the electronic component through a heat conductive material.

BRIEF DESCRIPTION OF DRAWINGS

FIGS. 4A and 4B are sectional views showing the manufacturing method of the heat sink according to the preliminary matter (Part 2);

FIG. 6 is a sectional view showing the manufacturing method of the heat sink according to the embodiment (Part 2);

DETAILED DESCRIPTION

An embodiment will be described below with reference to the accompanying drawings.

A preliminary matter underlying the embodiment will be described prior to description of the embodiment.

FIGS. 1A to 4B are views for explaining a heat sink according to the preliminary matter. Description of the preliminary matter is about the details of personal study of the present inventor, which contain technique contents not belonging to known techniques.

Figure 1A:
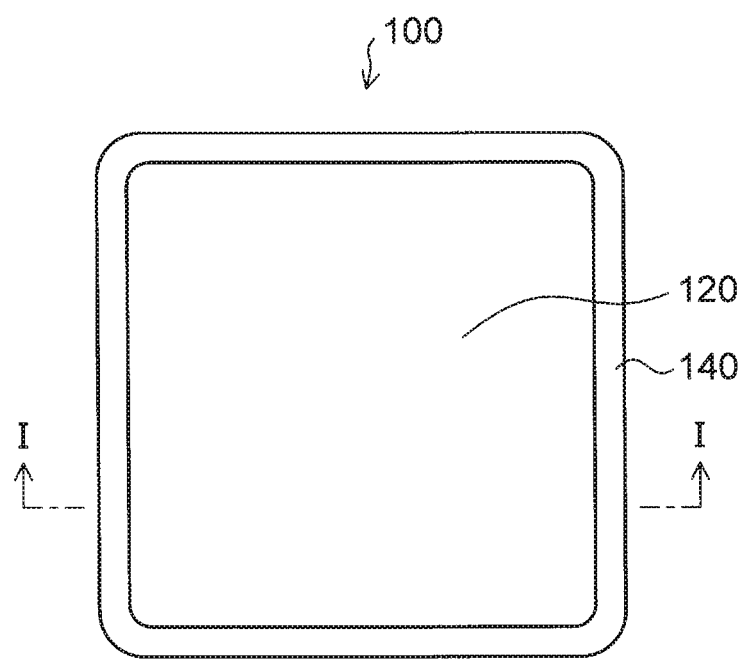
FIGS. 1A and 1B are a plan view and a sectional perspective view showing a heat sink according to a preliminary matter.
Figure 1B:
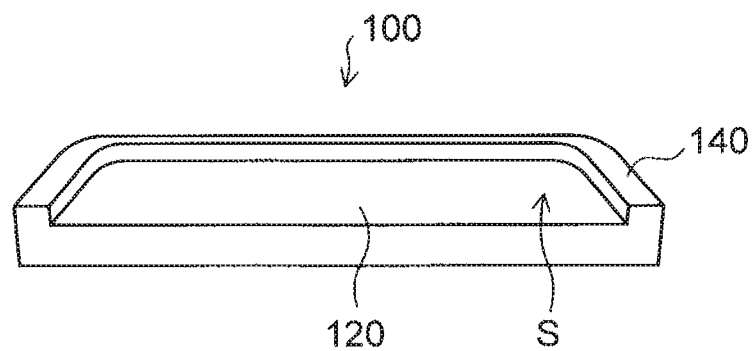

FIG. 1A is a plan view showing the heat sink according to the preliminary matter. FIG. 1B is a sectional perspective view taken along a line I-I of FIG. 1A. As shown in FIGS. 1A and 1B, the heat sink 100 according to the preliminary matter is formed from a flat plate portion 120 and a protruding portion 140. The protruding portion 140 is disposed on an outer peripheral portion of the flat plate portion 120 to surround a central portion of the flat plate portion 120 and protrudes upward. Since the protruding portion 140 is disposed on the outer peripheral portion of the flat plate portion 120, a housing portion S in which a semiconductor chip can be housed is provided.

Figure 2:
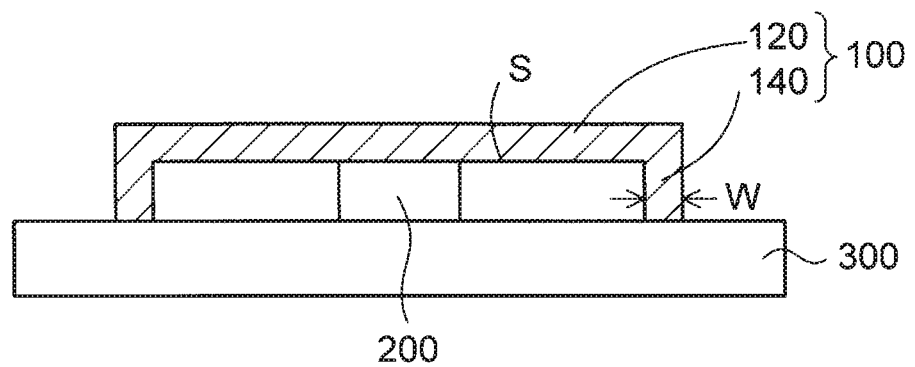
FIG. 2 is a sectional view showing a semiconductor device using the heat sink according to the preliminary matter.

As shown in FIG. 2, the protruding portion 140 of the heat sink 100 is fixed on a wiring board 300 on which a semiconductor chip 200 has been mounted. Thus, the semiconductor chip 200 is housed in the housing portion S of the heat sink 100. A back surface of the semiconductor chip 200 is thermally coupled to the heat sink 100.

The wiring board 300 of a semiconductor device in FIG. 2 warps convexly at normal temperature. When the semiconductor device is used in a heat cycle test or actually, temperature of the wiring board 300 increases to thereby bring the wiring board 300 into a flat state. When heat cycles are applied to the semiconductor device in this manner, bending stress is applied to the heat sink 100 due to a change in the warping state of the wiring board 300.

On this occasion, since a width W of the protruding portion 140 of the heat sink 100 is as small as about 2 mm, the protruding portion 140 of the heat sink 100 cannot resist the warping stress of the wiring board 300 to thereby result in bending of the heat sink 100. For this reason, tight contact between an inner surface of the heat sink 100 and the back surface of the semiconductor chip 200 may deteriorate or the heat sink 100 may come off the semiconductor chip 200. Consequently, excellent thermal coupling between the heat sink 100 and the semiconductor chip 200 may be spoiled.

When the width W of the protruding portion 140 of the heat sink 100 is increased to about 4 mm to 6 mm, the protruding portion 140 of the heat sink 100 can resist the warping stress of the wiring board 300. Accordingly, the heat sink 100 hardly bends even when the heat cycles are applied to the semiconductor device.

Since the heat sink 100 provided with the protruding portion 140 is manufactured by forging technology, it is however difficult to increase the width W of the heat sink 100.

Figure 3:
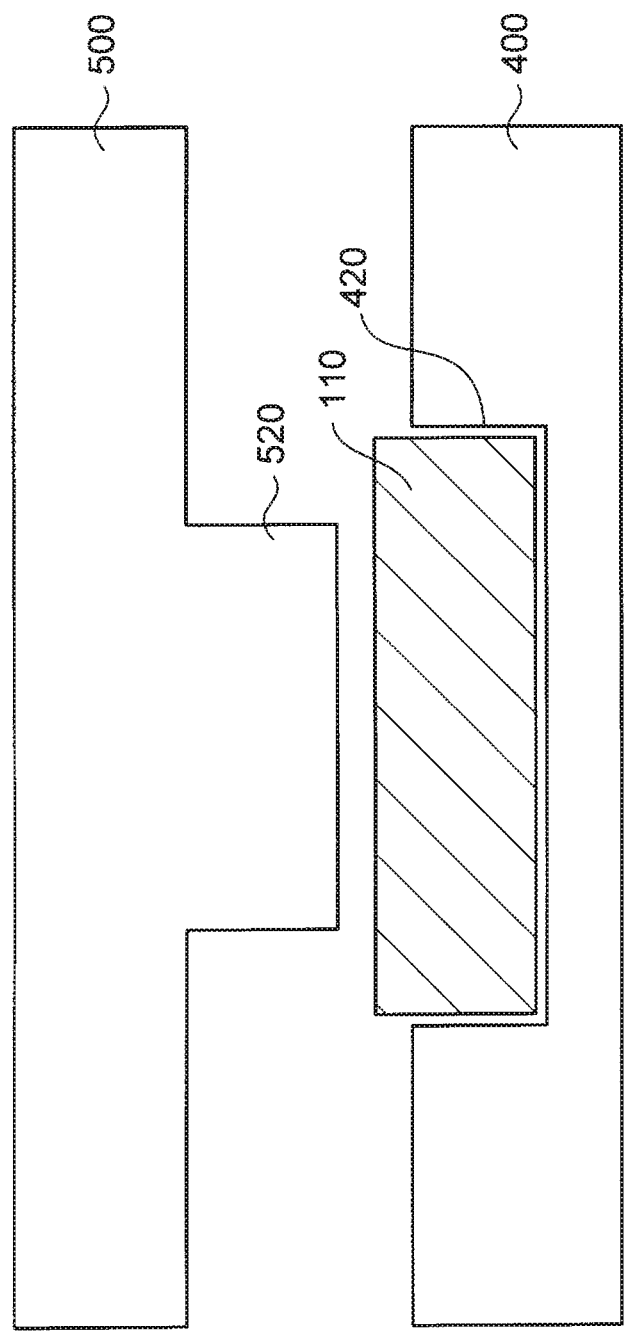
FIG. 3 is a sectional view showing a manufacturing method of the heat sink according to the preliminary matter (Part 1)

A method for manufacturing the heat sink 100 by the forging technology will be described with reference to FIG. 3 and FIGS. 4A and 4B. As shown in FIG. 3, a lower mold 400 which is provided with a recess 420 on its upper surface side, and an upper mold 500 which is provided with a protrusion 520 on its lower surface side are prepared. A rectangular metal plate 110 is prepared. A planar size of the recess 420 of the lower mold 400 corresponds to a planar size of the metal plate 110.

In addition, a planar size of the protrusion 520 of the upper mold 500 corresponds to a central portion of the metal plate 110 except an outer peripheral portion thereof.

The metal plate 110 is disposed in the recess 420 of the lower mold 400. The central portion of the metal plate 110 except the outer peripheral portion thereof is pressed downward by the protrusion 520 of the upper mold 500.

Thus, as shown in FIG. 4A, the outer peripheral portion of the metal plate 110 which is not pressed by the protrusion 520 of the upper mold 500 is pushed upward, so that a protruding portion 140 protruding upward is formed at the outer peripheral portion of the metal plate 110. On this occasion, the protruding portion 140 is formed to include a bulging portion 140a which flows outward between the lower mold 400 and the upper mold 500.

Further, as shown in FIG. 4B, the bulging portion 140a of the protruding portion 140 is punched out and removed by a puncher. Thus, the heat sink 100 provided with the protruding portion 140 of FIGS. 1A and 1B is obtained.

In order to use the protrusion 520 of the upper mold 500 to press the metal plate 110 to thereby push the outer peripheral portion of the metal plate 110 upward in the aforementioned FIG. 4A, it is necessary to apply a considerable press load to the upper mold 500. The limit of the width of the outer peripheral portion of the metal plate 110 for forming the protruding portion 140 is about 2 mm according to normal forging technology.

According to the forging technology, a maximum load that can be safely withstood by a mold during molding is determined in advance. Therefore, a press load exceeding the maximum load cannot be applied to the mold in order to prevent damage given to the mold.

In addition to the forging technology, there is another method of curving the outer peripheral portion of the metal plate, which is a thin plate, upward by a bending process so as to manufacture the heat sink 100 provided with the protruding portion 140. Also in such a bending process, the limit of a thickness of the metal plate is about 2 mm. It is therefore difficult to increase the width of the protruding portion 140 of the heat sink 100 to about 4 mm to 6 mm.

In addition to the forging technology and the bending process, there is further another method of using a router etc. to apply a cutting process to the central portion of the metal plate to thereby form a recess in the central portion of the metal plate in manufacturing the heat sink 100 provided with the protruding portion 140. By use of such a cutting process, the width of the protruding portion 140 of the heat sink 100 can be made as large as about 4 mm to 6 mm. However, a processing time of the cutting process on one metal plate is so long that production efficiency is poor. Therefore, the cutting process is not suitable for mass production in terms of cost.

The aforementioned problem can be solved by a heat sink and a manufacturing method of the heat sink according to an embodiment which will be described below.

The present inventor has found a technique to use the forging technology in manufacturing the heat sink with a novel structure strong against bending stress.

Embodiment

Figure 20:
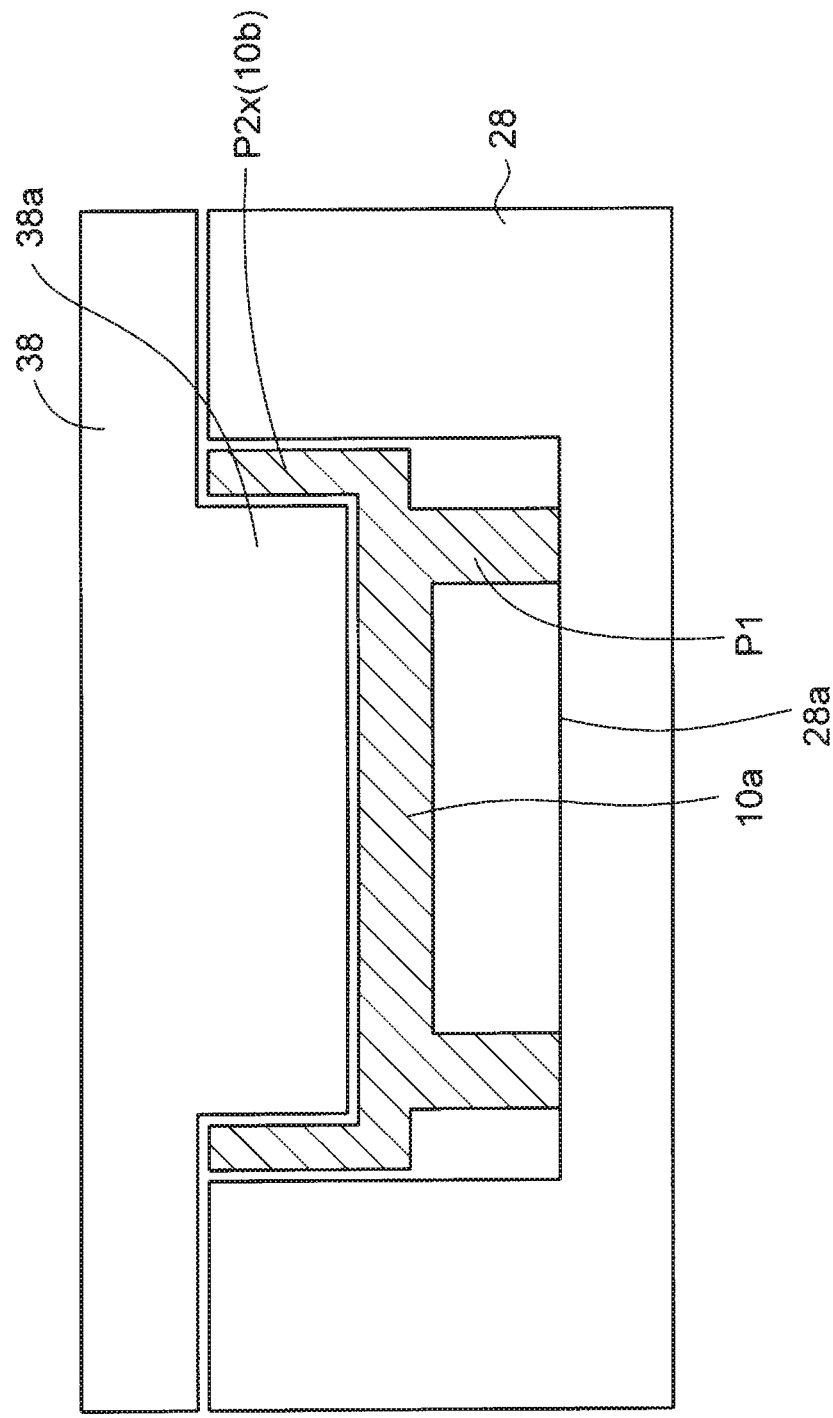
FIG. 20 is a sectional view showing the manufacturing method of the heat sink according to the modification of the embodiment (Part 2)
Figure 21:
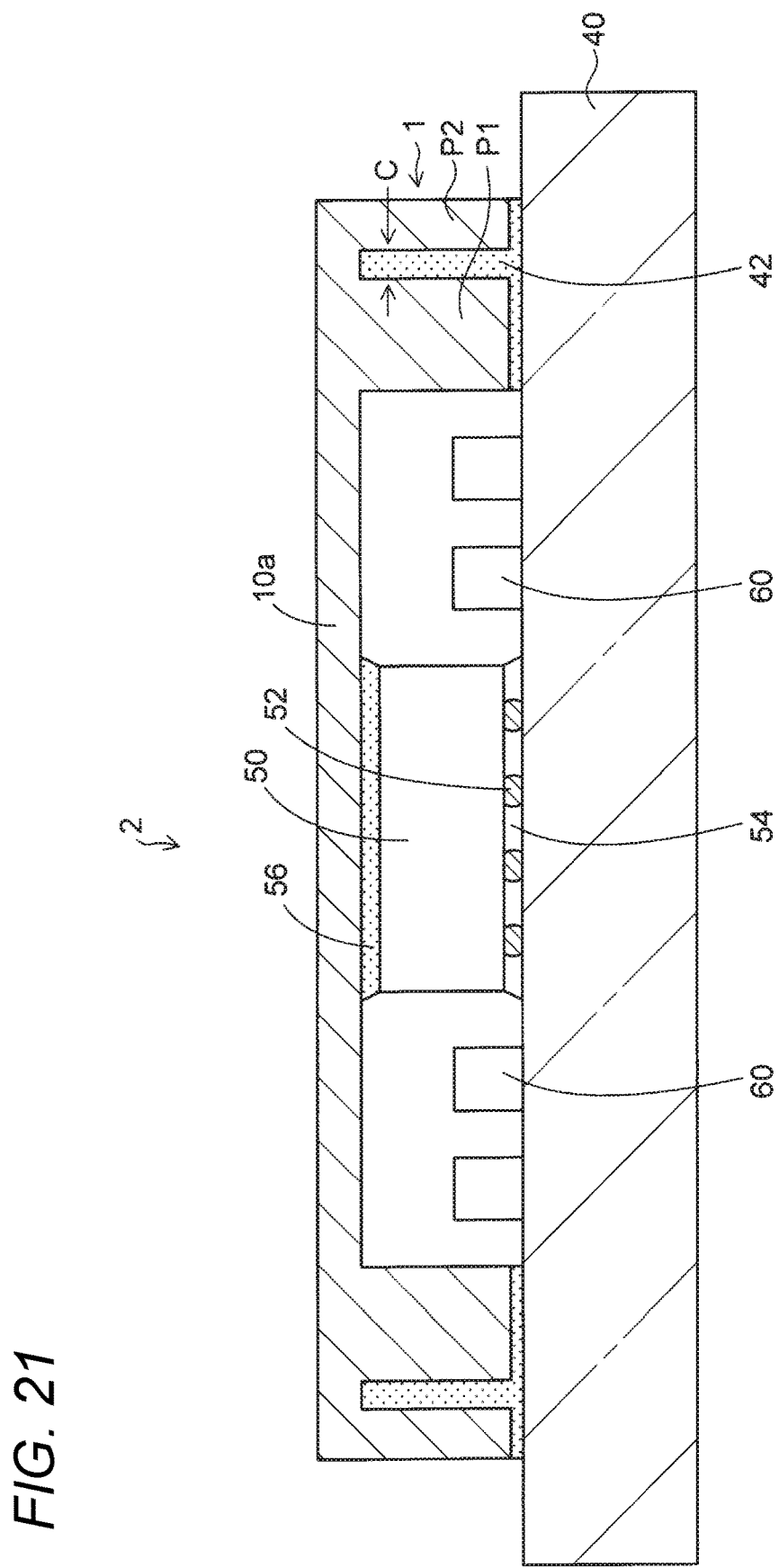
FIG. 21 is a sectional view showing an electronic component device according to the embodiment.
Figure 22:
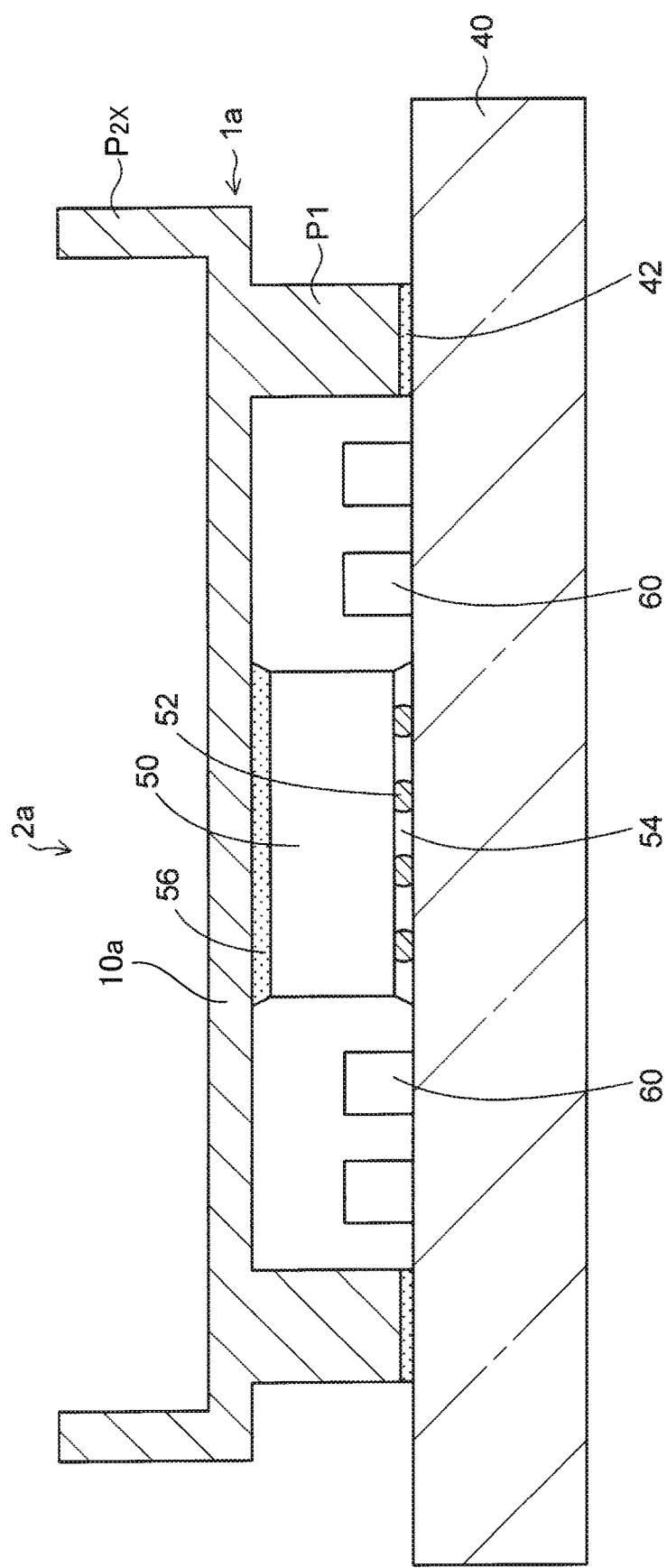
FIG. 22 is a sectional view showing an electronic component device according to the modification of the embodiment.

FIGS. 5 to 14 are views for explaining the manufacturing method of the heat sink according to the embodiment. FIGS. 15 to 20 are views for explaining the heat sink according to the embodiment. FIGS. 21 and 22 are views showing an electronic component device according to the embodiment. Structures of the heat sink and a semiconductor device will be described below while the manufacturing method of the heat sink is described.

Figure 5:
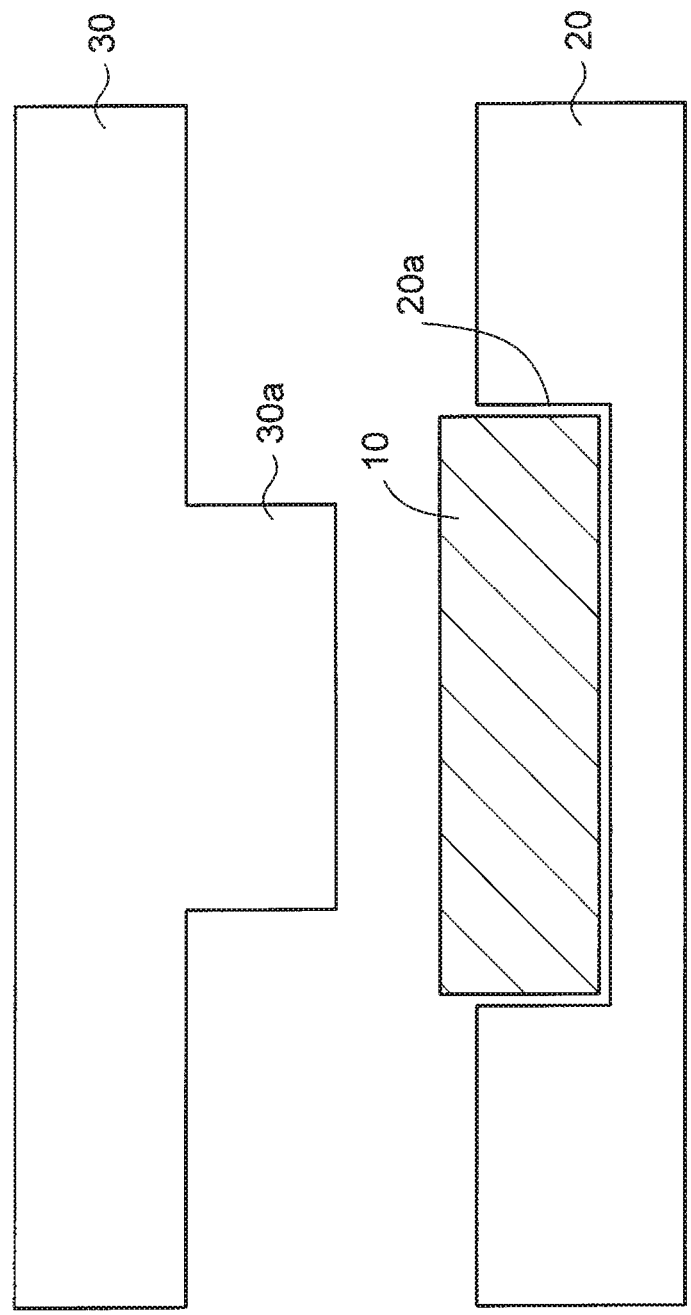
FIG. 5 is a sectional view showing a manufacturing method of a heat sink according to an embodiment (Part 1)

In the manufacturing method of the heat sink according to the embodiment, first, a lower mold 20 and an upper mold 30 are prepared as molds, as shown in FIG. 5. The lower mold 20 is provided with a recess 20a on its upper surface side. In addition, the upper mold 30 is provided with a protrusion 30a on its lower surface side. Further, a rectangular metal plate 10 in plan view is prepared.

A planar size of the recess 20a of the lower mold 20 corresponds to a planar size of the metal plate 10. In addition, a planar size of the protrusion 30a of the upper mold 30 is set to correspond to a planar size of a central portion of the metal plate 10 except an outer peripheral portion thereof.

The metal plate 10 is disposed in the recess 20a of the lower mold 20. For example, a copper plate or an aluminum plate or the like may be used as the metal plate 10. In addition, the metal plate 10 is about 3 mm to 4 mm thick. A planar size of the metal plate 10 measures from 40 mm by 40 mm to 70 mm by 70 mm.

Next, as shown in FIG. 6, the metal plate 10 is pressed downward by the protrusion 30a of the upper mold 30 in a state in which the metal plate 10 has been supported inside the recess 20a of the lower mold 20.

When the central portion of the metal plate 10 is squashed downward in this manner, the outer peripheral portion of the metal plate 10 is pushed upward. The upward pushed portion of the metal plate 10 flows outward along a space between the lower mold 20 and the upper mold 30.

As a result, the central portion of the metal plate 10 squashed thus serves as a flat plate portion 10a with a reduced thickness. At the same time, a first protruding portion P1 which is connected to the flat plate portion 10a and protrudes upward, and an extending portion 10b which extends outward from an upper portion of the side surface of the first protruding portion P1 are formed at the outer peripheral portion of the metal plate 10.

In this step, a width of the upward pushed outer peripheral portion of the metal plate 10 is set at about 2 mm. Accordingly, the metal plate 10 can be processed stably by normal forging technology.

Figure 7A:
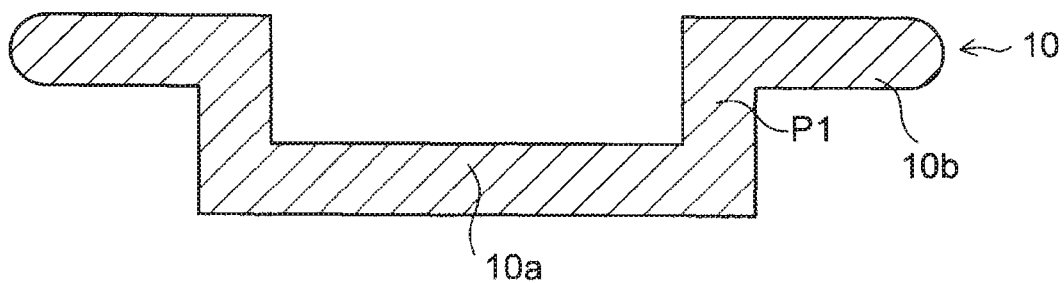
FIGS. 7A and 7B are a sectional view and a plan view showing the manufacturing method of the heat sink according to the embodiment (Part 3)
Figure 7B:
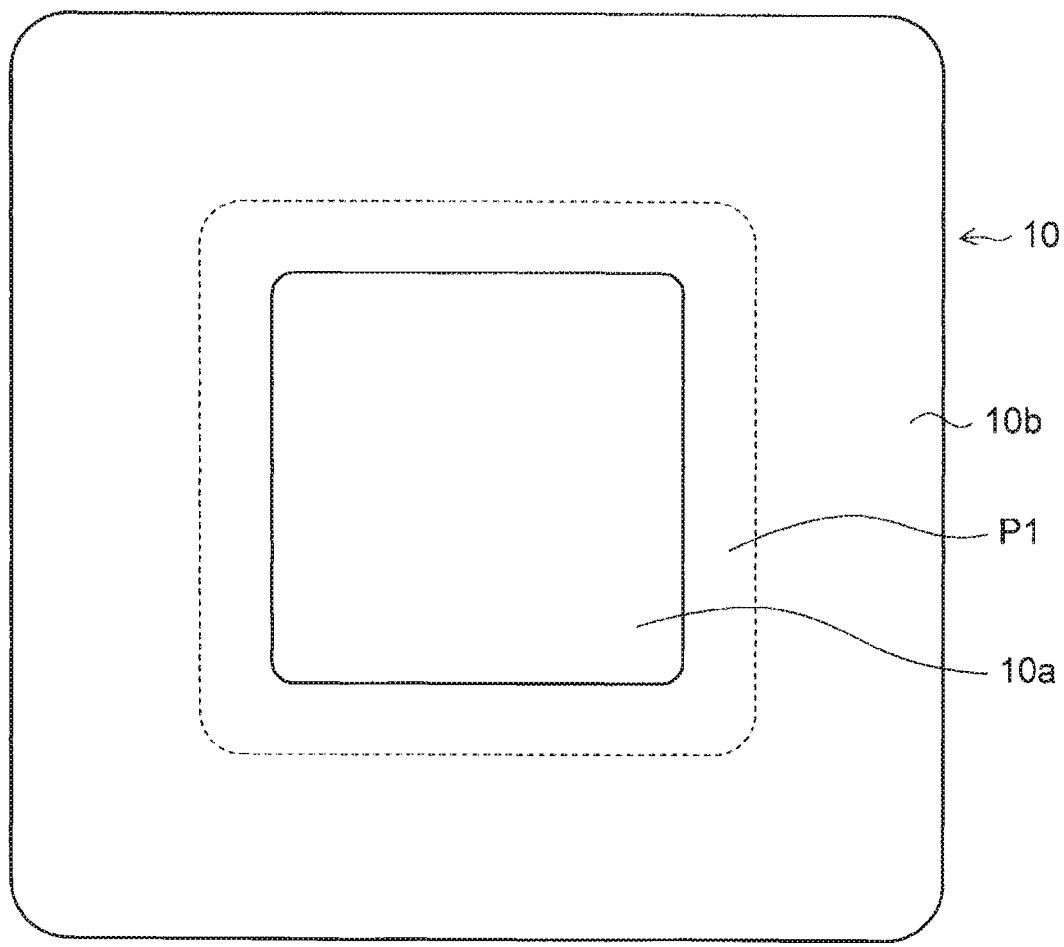

Then, as shown in FIG. 7A, the processed metal plate 10 of FIG. 6 is removed from the lower mold 20 and the upper mold 30. FIG. 7B is a plan view of the processed metal plate 10 of FIG. 7A.

As shown in FIGS. 7A and 7B, the first protruding portion P1 is shaped like a frame and disposed on the outer peripheral portion of the rectangular flat plate portion 10a. In addition, the extending portion 10b is shaped like a frame and connected to the upper-portion of side surface of the first protruding portion P1. A length of the extending portion 10b is set, for example, at about 4 mm to 6 mm.

The metal plate 10 is pressed by the molds in this manner. As a result, the flat plate portion 10a, the frame-shaped first protruding portion P1 which is disposed on the outer peripheral portion of the flat plate portion 10a and protrudes upward, and the extending portion 10b which extends outward from the upper-portion side surface of the first protruding portion P1 are formed. The first protruding portion P1 is formed on the outer peripheral portion of the flat plate portion 10a so as to surround the central portion of the flat plate portion 10a.

Figure 8:
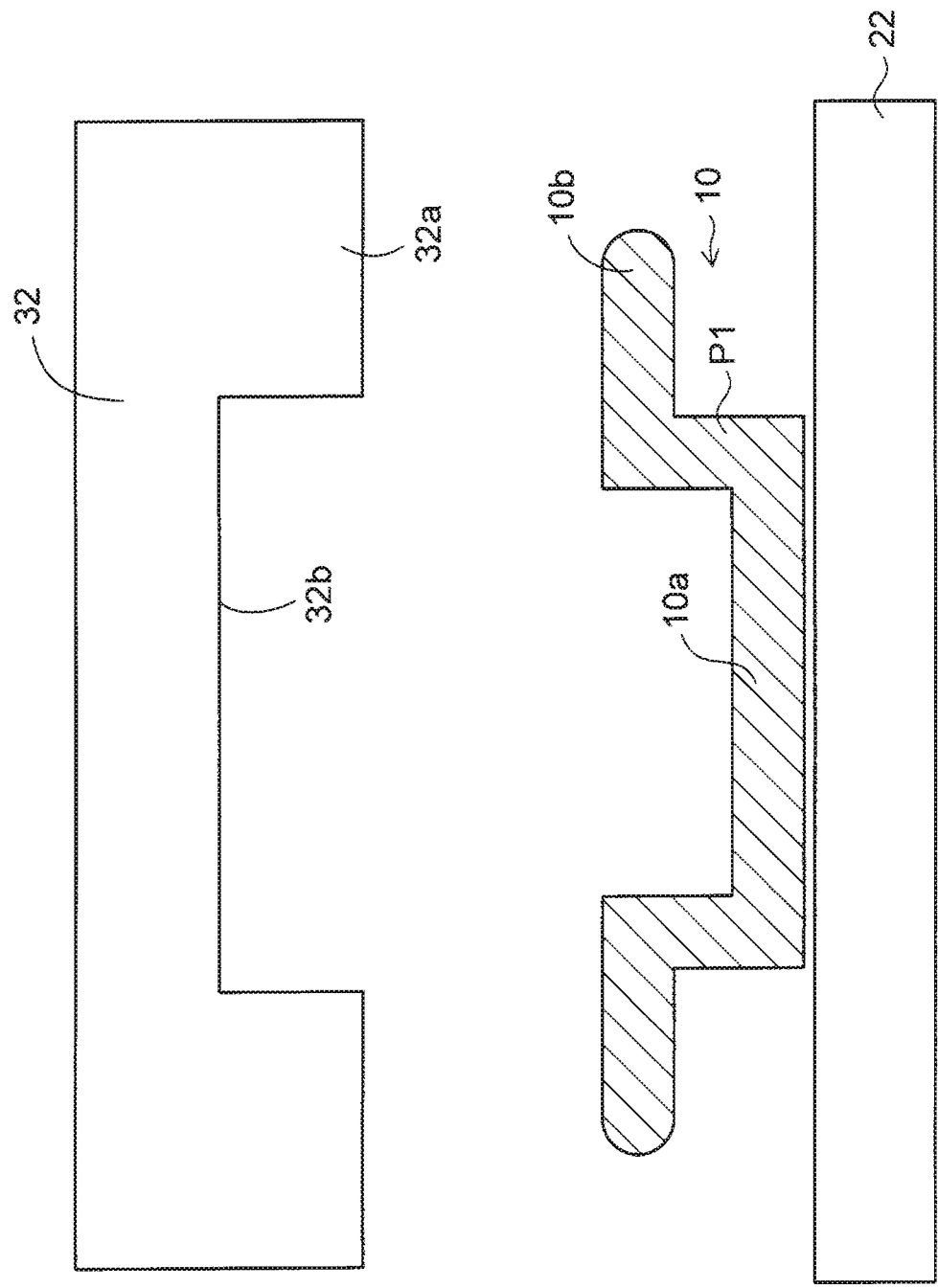
FIG. 8 is a sectional view showing the manufacturing method of the heat sink according to the embodiment (Part 4)

Next, a lower mold 22 and an upper mold 32 are prepared as molds, as shown in FIG. 8. The lower mold 22 is a flat plate-shaped support member which supports the metal plate 10.

The upper mold 32 is provided with a frame-shaped protrusion 32a corresponding to the extending portion 10b of the metal plate 10 of FIGS. 7A and 7B. In addition, the upper mold 32 is provided with a recess 32b in which the first protruding portion P1 of the metal plate 10 is housed when the extending portion 10b of the metal plate 10 is pressed by the protrusion 32a.

Figure 9:
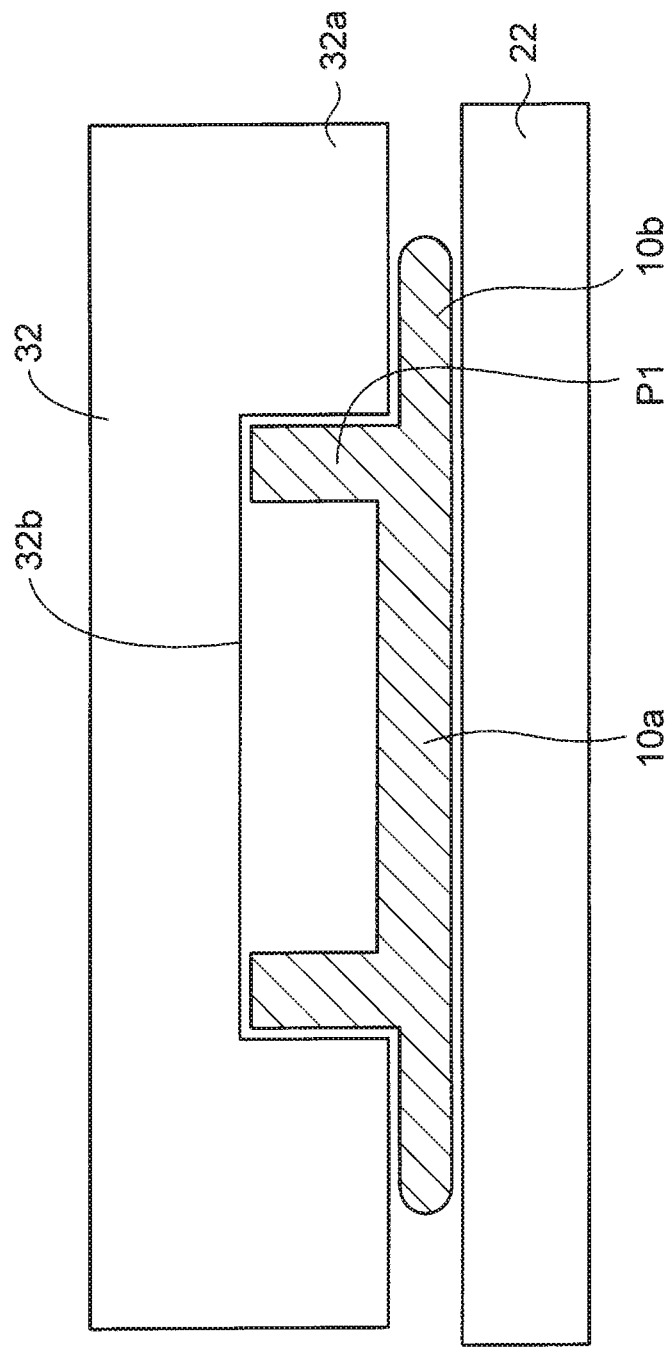
FIG. 9 is a sectional view showing the manufacturing method of the heat sink according to the embodiment (Part 5)

As shown in FIG. 9, the extending portion 10b of the metal plate 10 disposed on the lower mold 22 is pressed downward by the protrusion 32a of the upper mold 32. As a result, the extending portion 10b is moved from the upper portion of the side surface of the first protruding portion P1 to the lower portion of the side surface of the first protruding portion P1. On this occasion, the first protruding portion P1 of the metal plate 10 is housed in the recess 32b of the upper mold 32.

The extending portion 10b is moved downward by the molds in this manner. As a result, the extending portion 10b is connected to the lower portion of the side surface of the first protruding portion P1.

Figure 10A:
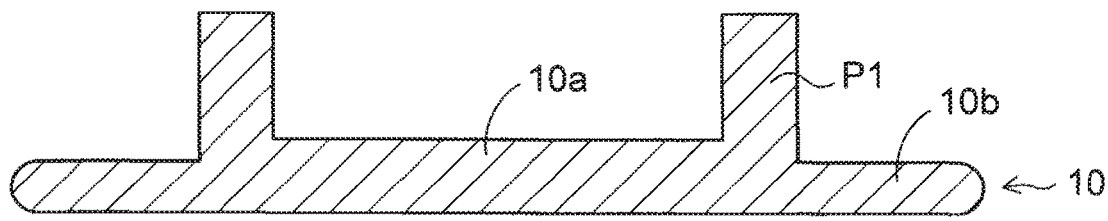
FIGS. 10A and 10B are a sectional view and a plan view showing the manufacturing method of the heat sink according to the embodiment (Part 6)
Figure 10B:
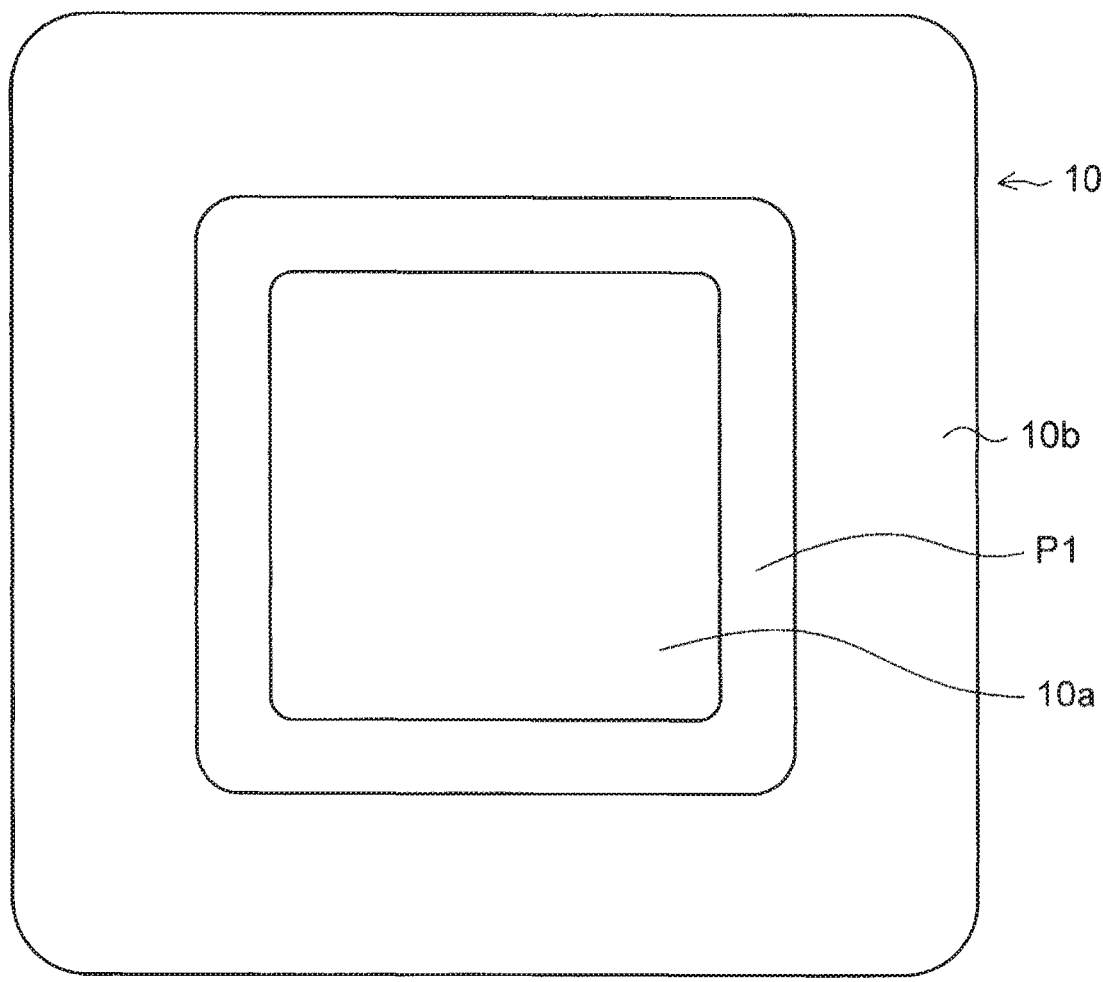

Then, the processed metal plate 10 of FIG. 9 is removed from the lower mold 22 and the upper mold 32, as shown in FIG. 10A. FIG. 10B is a plan view of the processed metal plate 10 of FIG. 10A. As shown in FIGS. 10A and 10B, the extending portion 10b is moved to the lower portion of the first protruding portion P1. As a result, the first protruding portion P1 is shaped like a rectangular frame in plan view.

The extending portion 10b is shaped like a frame and disposed to be connected to the lower portion of the side surface of the first protruding portion P1 on the outer peripheral portion of the flat plate portion 10a. The extending portion 10b is processed to be thinner in thickness than the flat plate portion 10a. This allows to make a bending process easy when the extending portion 10b is bent to form second protruding portions in a subsequent step. For example, the flat plate portion 10a is about 2.5 mm to 3.5 mm thick, and the extending portion 10b is about 1 mm to 2 mm thick.

Figure 11:
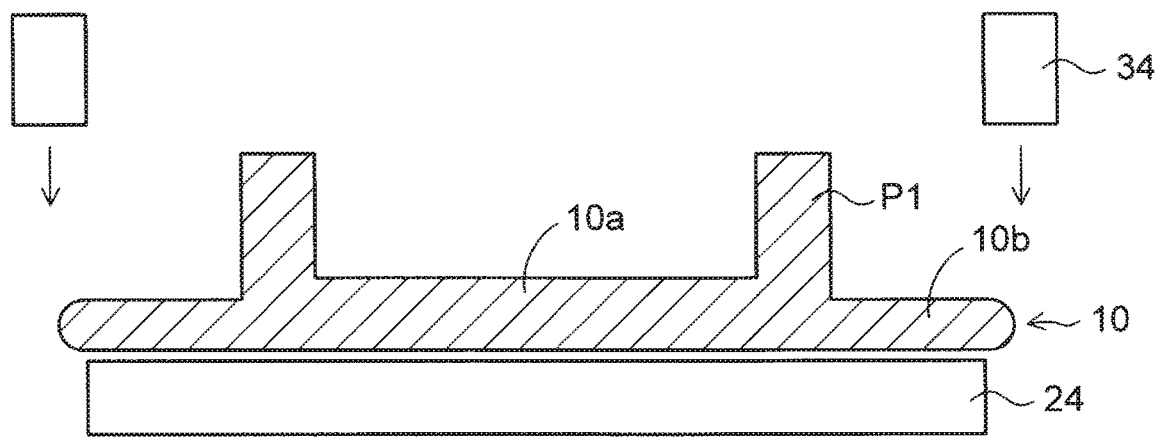
FIG. 11 is a sectional view showing the manufacturing method of the heat sink according to the embodiment (Part 7)

Next, the processed metal plate 10 of FIG. 10A is disposed on a lower mold 24, and a front end portion of the extending portion 10b of the metal plate 10 is punched out and removed by an upper mold 34, as shown in FIG. 11.

Figure 12:
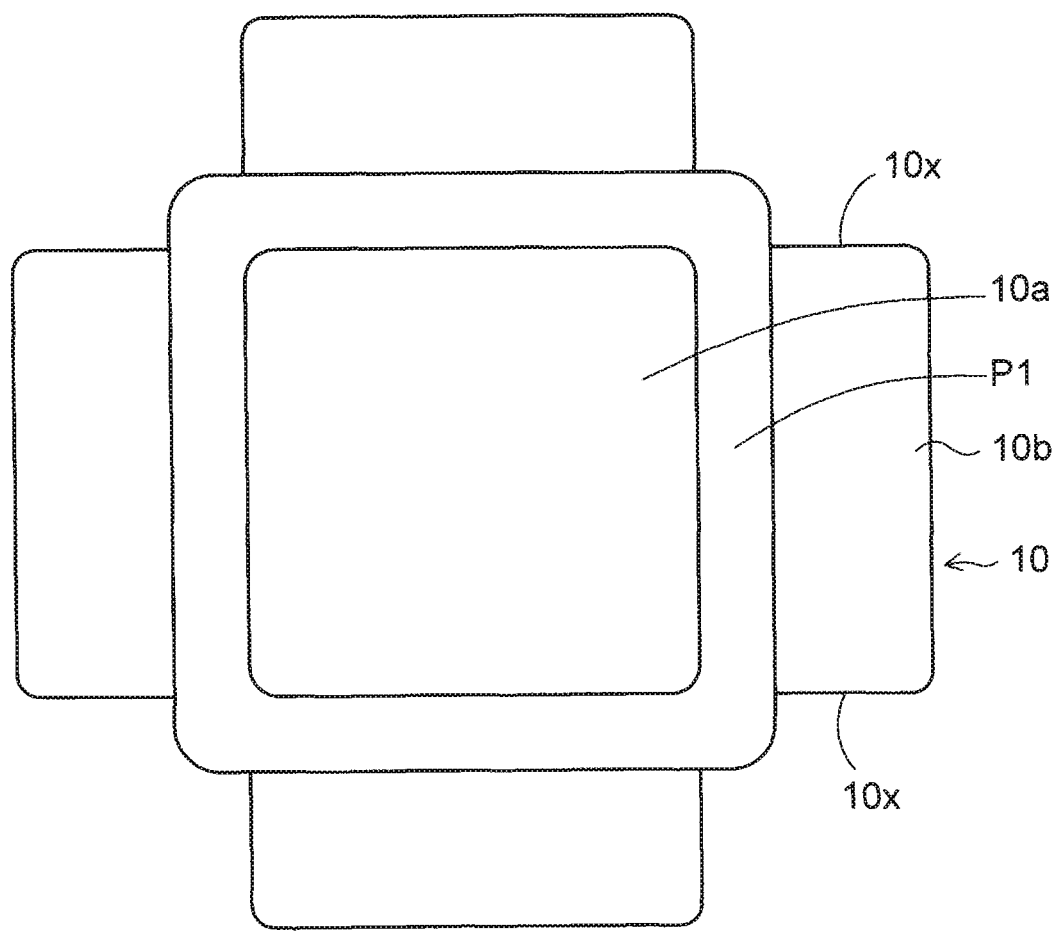
FIG. 12 is a plan view showing the manufacturing method of the heat sink according to the embodiment (Part 8)

On this occasion, portions of the extending portion 10b at regions outside four corners of the flat plate portion 10a are punched out and removed together with the front end portion of the extending portion 10b of the metal plate 10 by the upper mold 34, as shown in a plan view of FIG. 12. Thus, a round front end surface of the extending portion 10b of the metal plate 10 is processed into a flat surface. Simultaneously, the portions of the extending portion 10b at the regions outside the four corners of the first protruding portion P1 of the metal plate 10 are removed so that opening portions 10x are provided respectively. Thus, four corners of the external extending portion 10b which are opposed to the four corners of the first protruding portion P1 are removed.

Thus, remaining portions of the extending portion 10b of the metal plate 10 are disposed separately from one another on four sides of the frame-shaped first protruding portion P1.

Since the portions of the extending portion 10b at the regions outside the four corners of the first protruding portion P1 are removed in advance, a bending process can be facilitated when the remaining portions of the extending portion 10b (hereinafter simply referred to as the extending portions 10b) of the metal plate 10 are bent upward in a subsequent step.

Figure 13:
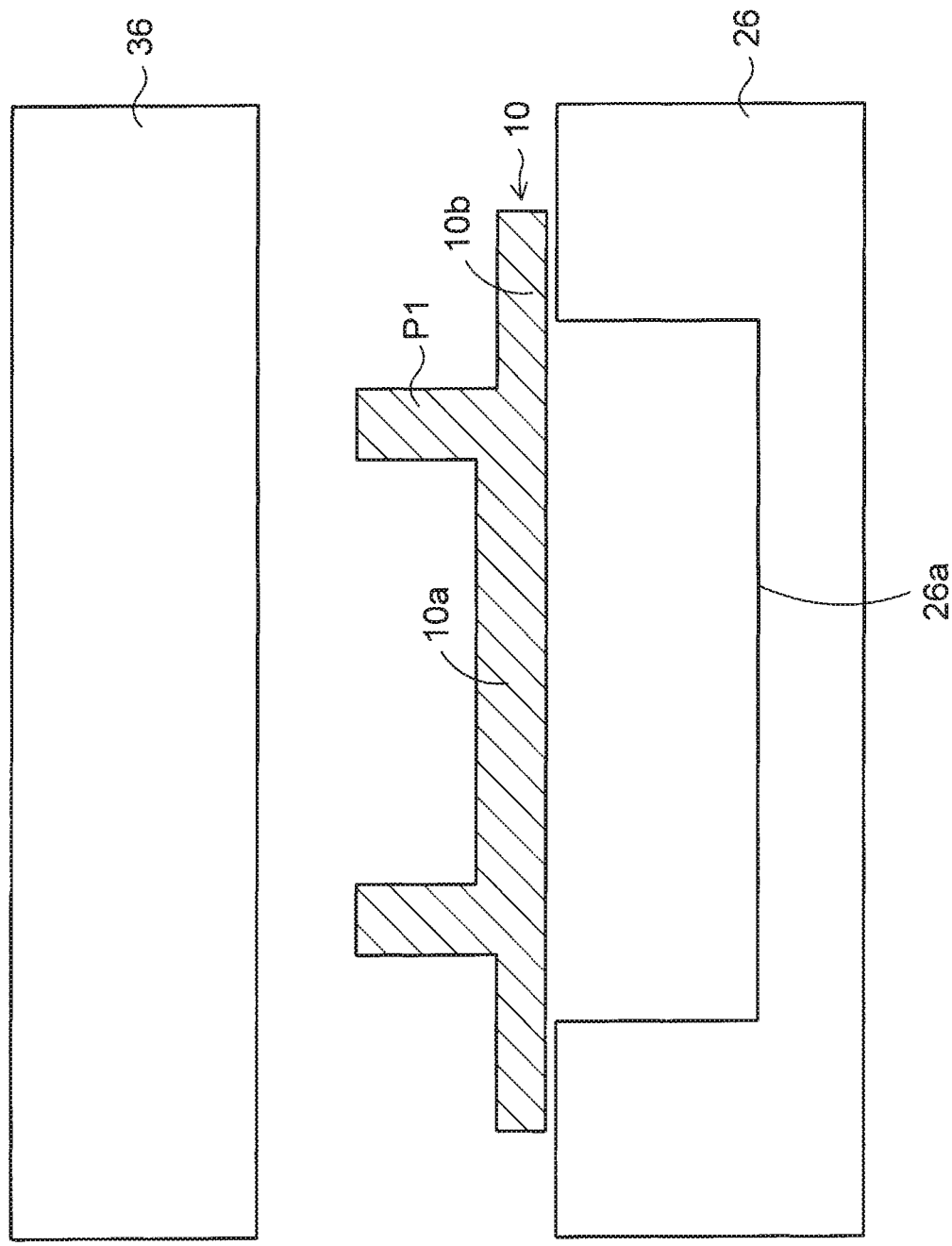
FIG. 13 is a sectional view showing the manufacturing method of the heat sink according to the embodiment (Part 9)

Next, a lower mold 26 and an upper mold 36 are prepared as molds, as shown in FIG. 13. The lower mold 26 is provided with a recess 26a on its upper surface side. The recess 26a of the lower mold 26 is formed into a rectangular shape corresponding to a rectangular region including the first protruding portion P1 of the processed metal plate 10 of FIG. 12.

The processed metal plate 10 of FIG. 12 is disposed on the lower mold 26. On this occasion, the extending portions 10b disposed on the four sides of the first protruding portion P1 of the metal plate 10 respectively are disposed on an upper surface of the lower mold 26 surrounding the recess 26a. In addition, the upper mold 36 is a flat plate-shaped pressing member.

Figure 14:
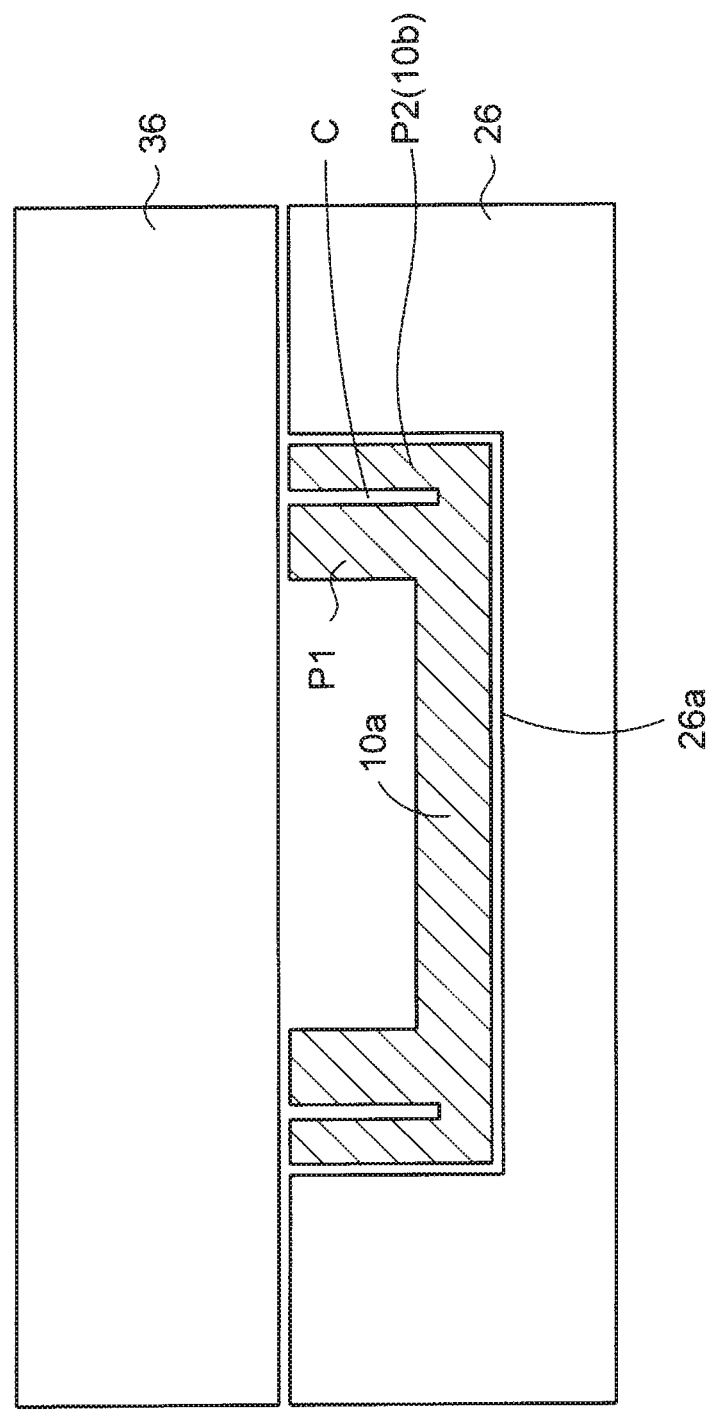
FIG. 14 is a sectional view showing the manufacturing method of the heat sink according to the embodiment (Part 10)

Successively, the metal plate 10 of FIG. 13 is pressed downward by the upper mold 36, as shown in FIG. 14. Thus, the extending portions 10b are bent upward at portions contacting an opening end of the recess 26a of the lower mold 26.

As a result, the extending portions 10b each disposed in a horizontal direction are bent in a vertical direction to serve as second protruding portions P2 connected to the first protruding portion P1. Lower portions of the second protruding portions P2 are formed to be connected to the lower portion of the first protruding portion P1. The first protruding portion P1 and each of the second protruding portions P2 are disposed side by side and protrude in the vertical direction. In addition, a gap C is provided between the first protruding portion P1 and the second protruding portion P2.

Since the extending portions 10b are bent thus in the same direction as the protruding direction of the first protruding portion P1, the second protruding portions P2 are formed outside the first protruding portion P1.

The first protruding portion P1 and the second protruding portions P2 may be formed to abut on each other respectively. In addition, a front end surface of the first protruding portion P1 and respective front end surfaces of the second protruding portion P2 are pressed by the upper mold 36. As a result, a position (level) of the front end surface of the first protruding portion P1 is substantially equal to positions (levels) of the front end surfaces of the second protruding portions P2 in the protruding direction of the first protruding portion P1 and the second protruding portions P2. Incidentally, when the extending portions 10b are shorter in length, the positions of the front end surfaces of the second protruding portions P2 may be lower than the position of the front end surface of the first protruding portion P1 in the protruding direction of the first protruding portion P1 and the second protruding portions P2.

Thus, by the normal forging technology, the first protruding portion P1 and the extending portions 10b are formed at the outer peripheral portion of the metal plate 10, and the extending portions 10b are bent upward so that the second protruding portions P2 used for reinforcement can be formed easily.

Then, the processed metal plate 10 of FIG. 14 is removed from the lower mold 26 and the upper mold 36.

Figure 15:
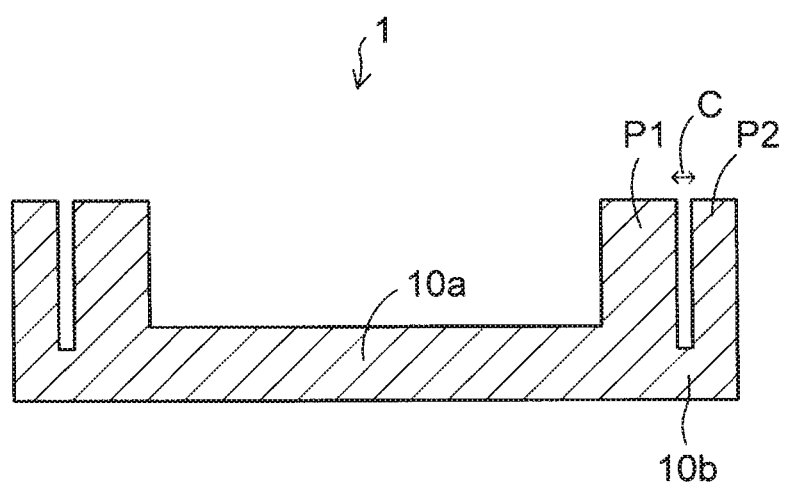
FIG. 15 is a sectional view showing the heat sink according to the embodiment.
Figure 16A:
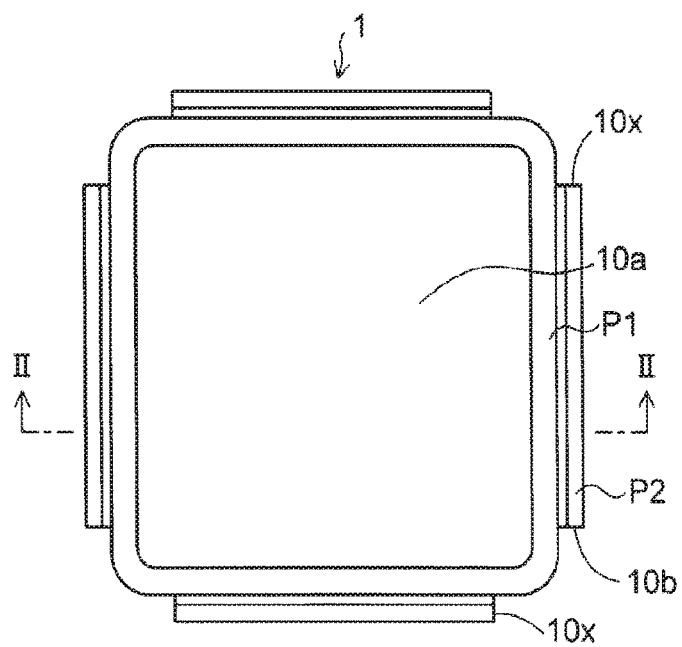
FIGS. 16A and 16B are a plan view and a sectional perspective view showing the heat sink according to the embodiment.
Figure 16B:
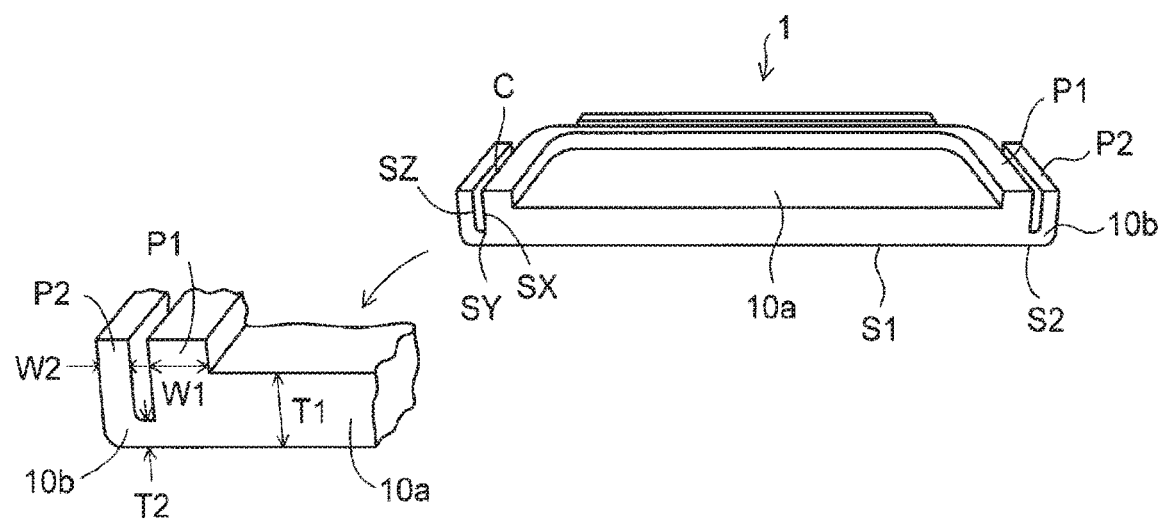

In the aforementioned manner, a heat sink 1 according to the embodiment is obtained, as shown in FIG. 15. FIG. 16A is a plan view showing the heat sink according to the embodiment. FIG. 16B is a perspective sectional view taken along a line II-II of FIG. 16A.

As shown in FIG. 15 and FIGS. 16A and 16B, the heat sink 1 according to the embodiment is provided with the rectangular flat plate portion 10a, and the first protruding portion P1 which is formed on the outer peripheral portion of the flat plate portion 10a and protrudes in a thickness direction of the flat plate portion 10a. The first protruding portion P1 is shaped like a frame and connected to the outer peripheral portion of the flat plate portion 10a. The outer periphery of the first protruding portion P1 is formed like a square shape in plan view.

In addition, the heat sink 1 is provided with the extending portions 10b which are formed on outer sides of the first protruding portion P1, and the second protruding portions P2 which are formed at the extending portions 10b. The second protruding portions P2 connected to the lower portion of the first protruding portion P1 protrude in the same direction as the protruding direction of the first protruding portion P1. Thus, the flat plate portion 10a, the first protruding portion P1, the extending portions 10b and the second protruding portions P2 are formed monolithically.

In addition, a lower surface S1 of the flat plate portion 10a and each of lower surfaces S2 of the extending portions 10b are formed to be flush with each other, as shown in FIG. 16B. The gap C (FIG. 15) is provided between the first protruding portion P1 and each of the second protruding portions P2. An interval of the gap C is, for example, about 1 mm.

The gap C is a concave space which is defined by an outer side surface SX of the first protruding portion P1, an upper surface SY of the extending portion 10b, and an inner side surface SZ of the second protruding portion P2. Alternatively, the first protruding portion P1 and the second protruding portion P2 may be formed to abut on each other.

Alternatively, a thickness T2 of the extending portion 10b is set to be thinner than a thickness T1 of the flat plate portion 10a, as shown in a partial enlarged view of FIG. 16B. Further, a width W2 of the second protruding portion P2 is set to be smaller than a width W1 of the first protruding portion P1. Alternatively, the width W2 of the second protruding portion P2 may be set to be the same as the width W1 of the first protruding portion P1. This allows to make the bending process easy when the extending portion 10b is bent to form the second protruding portion P2, as described above.

In addition, the front end surface of the first protruding portion P1 and the front end surface of the second protruding portion P2 are disposed at the same height position. Alternatively, the front end surface of the first protruding portion P1 may be disposed at a position protruding more outward than the front end surface of the second protruding portion P2.

In addition, the second protruding portions P2 are not disposed but the opening portions 10x of the second protruding portions P2 are provided at the regions outside the four corners of the first protruding portion P1 whose outer periphery is formed like a square shape, as shown in FIG. 16A. Thus, the second protruding portions P2 are disposed separately from one another on the four sides of the first protruding portion P1.

As shown in FIG. 16B, the housing portion S in which an electronic component can be housed is provided by the flat plate portion 10a and the first protruding portion P1 disposed on the outer peripheral portion of the flat plate portion 10a.

The first protruding portion P1 and the second protruding portions P2 of the metal plate 10 function as a leg portion fixed to a wiring board. The front end surface of the first protruding portion P1 and the respective front end surfaces of the second protruding portions P2 are fixed to the wiring board.

In the heat sink 1 according to the embodiment, the first protruding portion P1 is disposed on the outer peripheral portion of the flat plate portion 10a, and the second protruding portions P2 used for reinforcement are disposed on the outer sides of the first protruding portion P1.

Thus, the second protruding portions P2 are disposed side by side on the outer sides of the first protruding portion P1 of the heat sink 1. With this configuration, a width of the leg portion of the heat sink 1 can be substantially increased. Therefore, the heat sink is unlikely to bend even when bending stress is applied to the heat sink.

For example, the width W1 of the first protruding portion P1 is about 2 mm, and the width W2 of each of the second protruding portions P2 is about 1 mm to 2 mm. In this case, a total width of the first protruding portion P1 and the second protruding portion P2 including the gap C is increased to be about 4 mm to 5 mm.

In addition, by the normal forging technology, the first protruding portion P1 and the extending portions 10b connected to the first protruding portion P1 are formed at the outer peripheral portion of the metal plate 10, and the extending portions 10b are bent upward. Thus, the second protruding portions P2 used for reinforcement can be formed easily on the outer sides of the first protruding portion P1.

Accordingly, it is unnecessary to introduce any special manufacturing facility or any special manufacturing method. Therefore, it is possible to reliably manufacture the heat sink strong in bending strength without increasing the cost.

Figure 17:
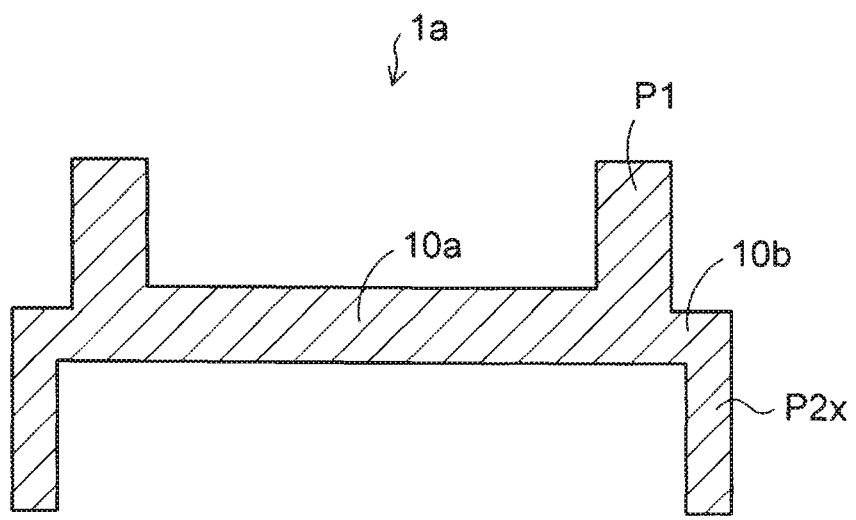
FIG. 17 is a sectional view showing a heat sink according to a modification of the embodiment.
Figure 18A:
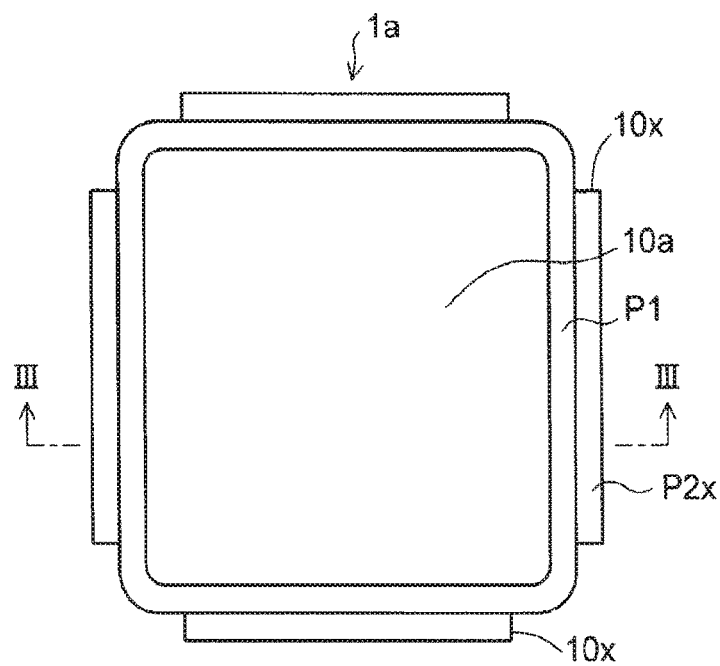
FIGS. 18A and 18B are a plan view and a sectional perspective view showing the heat sink according to the modification of the embodiment.
Figure 18B:
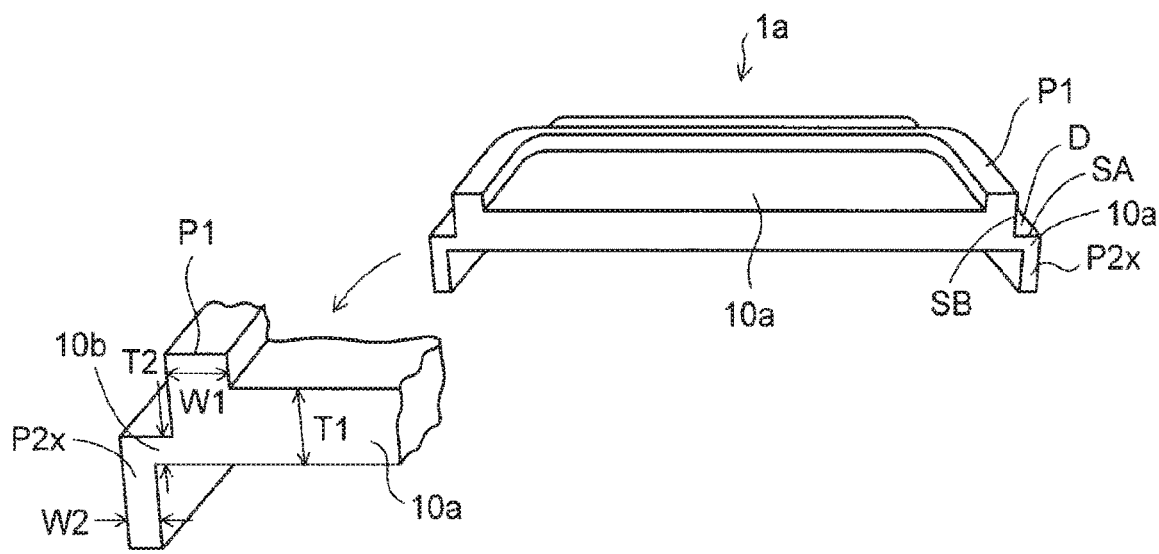

Next, a heat sink according to a modification of the embodiment will be described. FIG. 17 is a sectional view showing the heat sink according to the modification of the embodiment. FIG. 18A is a plan view showing the heat sink according to the modification of the embodiment. FIG. 18B is a sectional perspective view taken along a line III-III of FIG. 18A.

In the heat sink 1a according to the modification, as shown in FIG. 17 and FIGS. 18A and 18B, the second protruding portions P2 of the heat sink 1 of FIG. 15 and FIGS. 16A and 16B are replaced by second protruding portions P2x protruding in a direction opposite to a protruding direction of a first protruding portion P1.

In FIG. 17 and FIGS. 18A and 18B, elements other than the second protruding portions P2x are the same as those of the heat sink 1 in FIG. 15 and FIGS. 16A and 16B.

Also in the heat sink 1a according to the modification, as shown in FIG. 18A, the second protruding portions P2x are not disposed but opening portions 10x of the second protruding portions P2x are provided at regions outside four corners of the first protruding portion P1 whose outer periphery is formed like a rectangular shape, in a similar manner to or the same manner as those in the heat sink 1 of the aforementioned FIG. 16A.

When the heat sink 1a according to the modification is manufactured, different molds are used in the step of the aforementioned FIGS. 13 and 14 to bend extending portions 10b of a metal plate 10 in a direction opposite to the protruding direction of the first protruding portion P1.

Figure 19:
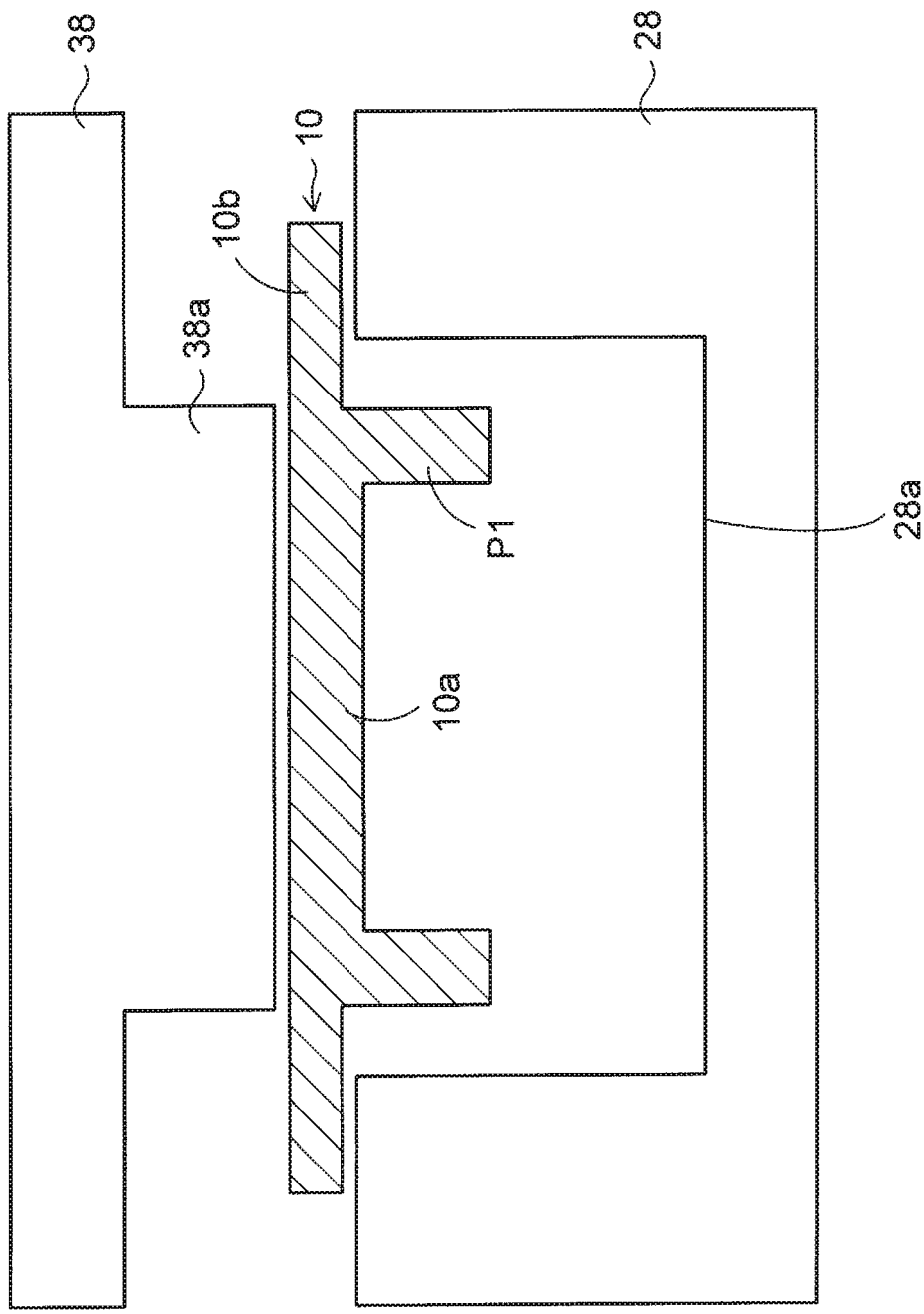
FIG. 19 is a sectional view showing a manufacturing method of the heat sink according to the modification of the embodiment (Part 1)

As shown in FIG. 19, the metal plate 10 of FIG. 13, and a lower mold 28 and an upper mold 38 serving as molds are prepared. The lower mold 28 is provided with a recess 28a on its upper surface side. In addition, the upper mold 38 is provided with a protrusion 38a on its lower surface side.

In a state in which the first protruding portion P1 of the metal plate 10 is disposed in the recess 28a of the lower mold 28, the extending portions 10b of the metal plate 10 are disposed on an upper surface of the lower mold 28 surrounding the recess 28a. Further, the metal plate 10 is pressed downward by the protrusion 38a of the upper mold 38. Thus, the extending portions 10b are bent upward at portions contacting an opening end of the recess 28a of the lower mold 28, as shown in FIG. 20. Since the extending portions 10b are in a direction opposite to the protruding direction of the first protruding portion P1, the second protruding portions P2 are formed on opposite sides to the first protruding portion P1.

In the heat sink 1a according to the modification, as shown in FIG. 18B, upper surfaces SA of the extending portions 10b formed on outer sides of the first protruding portion P1 are exposed in the outer periphery of the first protruding portion P1. In addition, a step D formed from an outer side surface SB of the first protruding portion P1 and each of the upper surfaces SA of the extending portions 10b is formed at the outer periphery of the first protruding portion P1.

In addition, configuration the same as that of the heat sink 1 of the aforementioned FIG. 16B can be applied to thicknesses T1, T2 and widths W1 and W2 of the heat sink 1a according to the modification shown in a partial enlarged view of FIG. 18B.

In the heat sink 1a according to the modification, the first protruding portion P1 functions as a leg portion fixed to a wiring board. The second protruding portions P2x protruding in the reverse direction to the protruding direction of the first protruding portion P1 are disposed on outer upper portions of the first protruding portion P1.

Thus, the wall-like second protruding portions P2x are provided erectly above four sides of the first protruding portion P1 (leg portion) in the heat sink 1a according to the modification. Accordingly, bending strength of the heat sink 1a is reinforced by the second protruding portions P2x. Therefore, the heat sink 1a hardly bends even when bending stress is applied to the heat sink 1a.

In addition, the metal plate 10 is processed by the normal forging technology in a similar manner to or the same manner as the heat sink 1 of FIGS. 16A and 16B. Thus, the second protruding portions P2x used for reinforcement can be formed easily on the outer sides of the first protruding portion P1.

Next, a method for applying the heat sink 1 of the embodiment shown in FIG. 15 and FIGS. 16A and 16B to an electronic component device will be described. As shown in FIG. 21, a wiring board 40 is prepared. Wiring layers (not shown) are formed on opposite surface sides of the wiring board 40, and the wiring layers on the opposite surface sides are connected to each other through a multilayer wiring layer (not shown) including vias formed therein.

Further, a semiconductor chip 50 provided with connection terminals 52 on its lower surface side is prepared. The connection terminals 52 of the semiconductor chip 50 are flip-chip connected to pads of the wiring layer on the upper surface side of the wiring board 40. Then, a gap on the lower side of the semiconductor chip 50 is filled with an underfill resin 54. The semiconductor chip 50 is, for example, a CPU chip etc. which generates a large amount of heat.

Further, capacitor elements 60 are mounted on the wiring board 40 to surround the semiconductor chip 50. In addition to the capacitor elements 60, a controller chip, a memory chip, etc. may be mounted on the wiring board 40.

The semiconductor chip 50 and the capacitor elements 60 are merely examples of electronic components. Various electronic components can be used. In this manner, the various electronic components can be mounted on the wiring board 40.

Further, the heat sink 1 of FIG. 16A is prepared. The front end surface of the first protruding portion P1 and the front end surfaces of the second protruding portions P2 of the heat sink 1 are bonded and fixed on the wiring board 40 by an adhesive agent 42. That is, when the heat sink 1 is mounted on the wiring board 40, the adhesive agent is provided between the first protruding portion P1 and the wiring board 40 and between the second protruding portions P2 and the wiring board 40.

On this occasion, a back surface of the semiconductor chip 50 is simultaneously connected and thermally coupled to an inner surface of the flat plate portion 10a of the heat sink 1 by a heat conductive material 56. An indium sheet, silicon grease, or a carbon nanotube sheet etc. can be used as the heat conductive material 56.

In addition, the gap C is provided between the first protruding portion P and each of the second protruding portions P2 of the heat sink 1. Accordingly, the gap C is filled with the adhesive agent 42. Thus, since an adhesive area of the heat sink 1 is increased, adhesive strength of the heat sink 1 can be improved.

In the aforementioned manner, an electronic component device 2 according to the embodiment is manufactured. The wiring board 40 of the electronic component device 2 shown in FIG. 21 warps convexly at normal temperature, as described in the preliminary matter. When the semiconductor chip is used in a heat cycle test or actually, temperature of the wiring board 40 increases to thereby bring the wiring board 40 into a flat state. When heat cycles are applied to the electronic component device 2 in this manner, bending stress is applied to the heat sink 1 due to a change in the warping state of the wiring board 40.

In the heat sink 1 of the electronic component device 2, the leg portion of the heat sink 1 fixed to the wiring board 40 is formed from the first protruding portion P1 and the second protruding portions P2, as described above. Therefore, the width of the leg portion of the heat sink 1 is substantially increased. Accordingly, bending strength of the heat sink 1 is reinforced.

Accordingly, even when the bending stress is applied to the heat sink 1 due to the change in the warping state of the wiring board 40 caused by the heat cycles, the heat sink 1 is unlikely to bend. Thus, tight contact between the inner surface of the heat sink 1 and the back surface of the semiconductor chip 50 can be prevented from deteriorating or the heat sink 1 can be prevented from coming off the semiconductor chip 50.

Thus, in the electronic component device 2 according to the embodiment, heat generated from the semiconductor chip 50 can be excellently dissipated to the heat sink 1 through the heat conductive material 56 so that reliability of the electronic component device 2 can be improved.

An electronic component device 2a according to the modification of the embodiment is shown in FIG. 22. In the electronic component device 2a according to the modification shown in FIG. 22, the heat sink 1a of the modification shown in FIG. 17 is used in place of the heat sink 1 of the electronic component device 2 shown in FIG. 21. In FIG. 22, the other elements than the heat sink 1a are the same as those of the electronic component device 2 shown in FIG. 21. Accordingly, in FIG. 22, the other elements than the heat sink 1a will be referred to by the same signs correspondingly and respectively, and description thereof will be omitted.

As shown in FIG. 22, the first protruding portion P1 protruding downward from the outer peripheral portion of the flat plate portion 10a of the heat sink 1a is disposed in the electronic component device 2a according to the modification. Further, the second protruding portions P2x protruding upward are connected to the outer upper portions of the first protruding portion P1.

In this manner, the wall-like second protruding portions P2x are provided just above the four sides of the first protruding portion P1 (leg portion) of the heat sink 1a fixed to the wiring board 40. Accordingly, bending strength of the heat sink 1a is reinforced by the second protruding portions P2x.

Accordingly, even when the warping state of the wiring board 40 of the electronic component device 2a changes, the heat sink 1a is unlikely to bend in a similar manner to or the same manner as the electronic component device 2 shown in FIG. 21. Accordingly, heat generated from the semiconductor chip 50 can be excellently dissipated to the heat sink 1a.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

(1) A method of manufacturing a heat sink, the method comprising:

(a) preparing a metal plate;

(b) pressing the metal plate using a mold so as to form a flat plate portion, a first protruding portion and an extending portion, wherein the first protruding portion is formed on an outer peripheral portion of the flat plate portion so as to surround a central portion of the flat plate portion and protrudes in a thickness direction of the flat plate portion, and the extending portion extends outward from the flat plate portion;

(c) pressing the extending portion downward using a mold so as to move the extending portion from an upper portion of a side surface of the first protruding portion toward a lower portion of the side surface of the first protruding portion; and (d) bending the extending portion so as to form a second protruding portion, wherein the second protruding portion is formed on the extending portion such that the first protruding portion is positioned between the second protruding portion and the central portion of the flat plate and protrudes in the thickness direction of the flat plate portion.

(2) The method according to clause (1), wherein in the step (d), the second protruding portion protrudes in the same direction as a protruding direction of the first protruding portion, and a gap is provided between the first protruding portion and the second protruding portion.

(3) The method according to clause (1), wherein in the step (b), the first protruding portion is formed into a frame shape in a plan view, and wherein, between the step (c) and the step (d), the method further comprises:

(e) removing a front end portion of the extending portion; and (f) removing four corners of the extending portion which are opposed to four corners of the first protruding portion.

(4) The method according to clause (1), wherein the extending portion is thinner in thickness than the flat plate portion in the step (b).

(5) The method according to clause (1), wherein, in the step (d), the second protruding portion protrudes in the same direction as a protruding direction of the first protruding portion, and a level of a front end surface of the first protruding portion is substantially equal to that of a front end surface of the second protruding portion in the protruding direction of the first protruding portion and the second protruding portion.

What is claimed is:

1. A heat sink comprising:
a flat plate portion;
a first protruding portion which is formed on an outer peripheral portion of the flat plate portion so as to surround a central portion of the flat plate portion and which protrudes in a thickness direction of the flat plate portion, and the first protruding portion is formed into a frame shape in a plan view;
an extending portion which extends outward from the flat plate portion; and
a second protruding portion which is formed on the extending portion such that the first protruding portion is positioned between the second protruding portion and the central portion of the flat plate portion and which protrudes in the thickness direction of the flat plate portion, the second protruding portion is formed on the extending portion such that the second protruding portion discontinuously surrounds the first protruding portion such that the second protruding portion is not opposed to the first protruding portion at four corners of the first protruding portion,
wherein the flat portion, the extending portion, the first protruding portion, and the second protruding portion are integrally formed as a unitary piece.

2. The heat sink according to claim 1, wherein
the second protruding portion protrudes in the same direction as a protruding direction of the first protruding portion, and
a gap is provided between the first protruding portion and the second protruding portion.

3. The heat sink according to claim 1, wherein
the second protruding portion includes segments which extend along sides of the frame shape of the first protruding portion between adjacent corners of the frame shape of the first protruding portion.

4. The heat sink according to claim 1, wherein the extending portion is thinner in thickness than the flat plate portion.

5. The heat sink according to claim 1, wherein
the second protruding portion protrudes in the same direction as a protruding direction of the first protruding portion, and
a level of a front end surface of the first protruding portion is substantially equal to that of a front end surface of the second protruding portion in the protruding direction of the first protruding portion and the second protruding portion.

6. The heat sink according to claim 1, wherein
the second protruding portion protrudes in the same direction as a protruding direction of the first protruding portion, and
a level of a front end surface of the first protruding portion is lower than the level of a front end surface of the second protruding portion in the protruding direction of the first protruding portion and the second protruding portion.

7. The heat sink according to claim 1, wherein the second protruding portion protrudes in a direction opposite to a protruding direction of the first protruding portion.

8. An electronic component device comprising:
a wiring board;
an electronic component which is mounted on the wiring board; and
a heat sink which is mounted on the wiring board so as to be thermally connected to the electronic component,
wherein the heat sink comprises:
a flat plate portion;
a first protruding portion which is formed on an outer peripheral portion of the flat plate portion so as to surround the electronic component and which protrudes in a thickness direction of the flat plate portion;
an extending portion which extends outward from the flat plate portion; and
a second protruding portion which is formed on the extending portion such that the first protruding portion is positioned between the second protruding portion and the electronic component and which protrudes in a thickness direction of the flat plate portion in a same direction as a protruding direction of the first protruding portion, and
wherein the first protruding portion and the second protruding portion are i& mounted on the wiring board and the flat plate portion is connected to the electronic component through a heat conductive material,
an adhesive agent is provided between the first protruding portion and the wiring board, between the second protruding portion and the wiring board, and in a pap formed between the first protruding portion and the second protruding portion, and
the flat portion, the extending portion, the first protruding portion, and the second protruding portion are integrally formed as a unitary piece.

* * * * *